United States Patent
Goyal et al.

(10) Patent No.: US 7,360,133 B2
(45) Date of Patent: *Apr. 15, 2008

(54) METHOD FOR CREATING A JTAG TAP CONTROLLER IN A SLICE FOR USE DURING CUSTOM INSTANCE CREATION TO AVOID THE NEED OF A BOUNDARY SCAN SYNTHESIS TOOL

(75) Inventors: Saket Goyal, Milpitas, CA (US); James Ngo, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 247 days.

This patent is subject to a terminal disclaimer.

(21) Appl. No.: 10/847,691

(22) Filed: May 18, 2004

(65) Prior Publication Data

US 2005/0262460 A1   Nov. 24, 2005

(51) Int. Cl.
*G01R 31/3185* (2006.01)
*G01R 31/316* (2006.01)
(52) U.S. Cl. ........................................ 714/726; 703/25
(58) Field of Classification Search ................ 714/726, 714/738, 733; 326/16
See application file for complete search history.

(56) References Cited

U.S. PATENT DOCUMENTS

| | | | | |
|---|---|---|---|---|
| 5,682,392 | A * | 10/1997 | Raymond et al. | 714/727 |
| 6,427,217 | B1 * | 7/2002 | Hartnett | 714/733 |
| 6,973,608 | B1 * | 12/2005 | Abramovici et al. | 714/725 |
| 7,188,330 | B2 * | 3/2007 | Goyal | 716/18 |
| 2002/0083387 | A1 * | 6/2002 | Miner et al. | 714/726 |
| 2004/0209171 | A1 * | 10/2004 | Ibusuki | 430/5 |
| 2005/0039089 | A1 * | 2/2005 | Gedamu et al. | 714/718 |

* cited by examiner

*Primary Examiner*—Guy Lamarre
*Assistant Examiner*—Dipakkumar Gandhi
(74) *Attorney, Agent, or Firm*—Strategic Patent Group (57) ABSTRACT

A method and system is provided for creating a tap controller in a slice for use during custom instance creation to avoid the need of a boundary scan synthesis tool. Aspects of the present invention include during slice creation, using a software tool to create a test access port (TAP) from slice resources; during instance creation, allowing a customer to design a custom chip using the software tool to select which structures to use on the slice; and based on the customer selections, reconfiguring at the instance level connections between the tap controller and the selected structures.

24 Claims, 9 Drawing Sheets

METHOD FOR CREATING A JTAG TAP CONTROLLER IN A SLICE FOR USE DURING CUSTOM INSTANCE CREATION TO AVOID THE NEED OF A BOUNDARY SCAN SYNTHESIS TOOL

CROSS-REFERENCE TO RELATED APPLICATION

This application is related to co-pending U.S. application Ser. No. 10/847,692 entitled "Handling of Unused Coreware with Embedded Boundary Scan Chains to Avoid the Need of a Boundary Scan Synthesis Tool During Custom Instance Creation," assigned to the assignee of the present application and filed on the same day as the present application.

FIELD OF THE INVENTION

The present invention relates generally to optimizing the design process of custom application specific integrated circuits (ASICs), and more particularly to creating a JTAG tap controller in a slice for use during custom instance creation to avoid the need of a boundary scan synthesis tool.

BACKGROUND OF THE INVENTION

The assignee of the present application has developed RapidChip™ technology that lets designers quickly and affordably create high-performance, complex, customized ICs. RapidChip is a chip building technique that dramatically lowers cost, risk and time-to-market. Each RapidChip™ slice is a pre-manufactured, pre-verified chip at the density and power of an ASIC in which all silicon-based layers have been built, leaving the top metal layers to be completed with the customer's unique intellectual property. The customer selects a desired slice that best accommodates their application, and then use a software tool suite to create a proprietary design, called an instance, using the gates on the final metal layers of the chip. The result is a completed chip with near ASIC performance and density, done in the time it takes to do an FPGA, yet at much lower unit cost.

The RapidChip procedure includes the following steps: 1) an IC manufacturer provides one or more pre-built slices; 2) a customer creates a custom design by selecting what components of the slice will be used in the instance; and 3) the custom design is prepared for handoff to the IC manufacturer with a RapidWorx™ design suite.

The fundamental technology used in the RapidChip technology is the metal customization of a partially manufactured semiconductor device, called a slice, in which all silicon layers have been fabricated. Each slice incorporates diffused memory blocks, PLLs, IP blocks from a CoreWare® library, configurable transistor fabric, and an I/O ring made up of configurable and dedicated I/Os for specific requirements.

RapidReady Coreware, referred to herein as coreware, allows for integration of additional third party IP blocks (cores). A common methodology among all coreware reduces the time to design by simplifying the integration process. Coreware can be delivered in several forms to optimize for performance or flexibility: diffused, hard, firm, or soft.

Diffused coreware is fixed, pre-built, and verified in the RapidChip silicon platform and has the same high performance specifications as a cell-based ASIC. Examples of diffused IP blocks, or cores, include transceivers, PLLs, and ARM® CPUs. Examples of firm or soft IP are PCS macros, Ethernet MACs, and memory controllers. Diffused and hard coreware cores are delivered to RapidChip designers as an abstracted timing model. Soft RapidReady IP is delivered as Register Transfer Level (RTL). It provides maximum flexibility since it is synthesized during the physical synthesis step in the RapidWorx design system.

Coreware simulation models are delivered in RTL. As is well known in the art, RTL is a high-level hardware description language for defining digital circuits. The circuits are described as a collection of registers, Boolean equations, and control logic. The most popular RTL languages are VHDL and Verilog. RTL specifications are turned into gate-level netlists.

Figure 1:
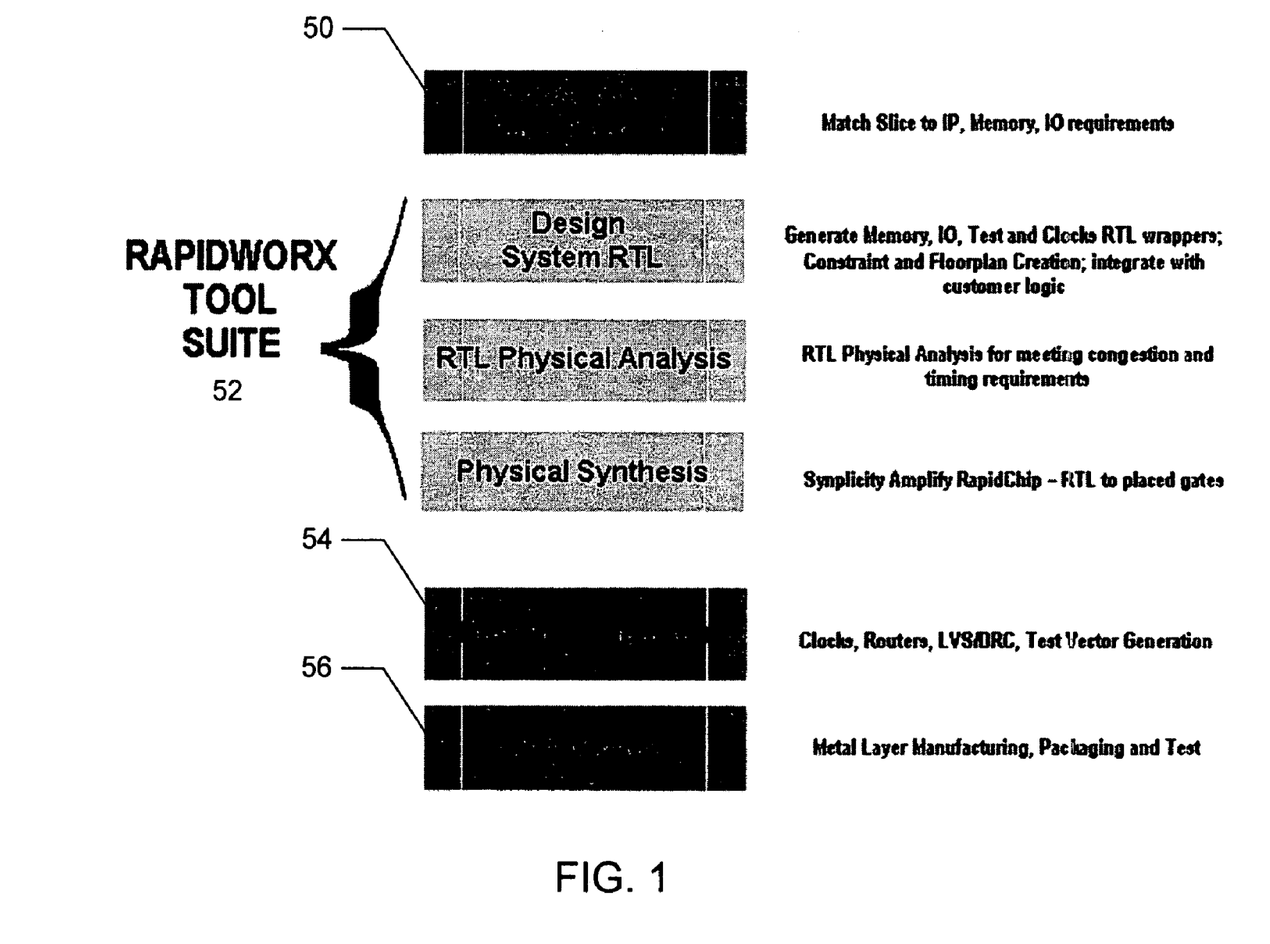
FIG. 1 is a diagram illustrating the RapidChip design flow to create a custom instance from a slice by the IC manufacturer.

FIG. 1 is a diagram illustrating the RapidChip design flow to create a custom instance from a slice by the IC manufacturer. First, the customer enters initial design parameters in order to populate the design-specific database, and imports customer-specific or third party cores and intellectual property (IP) to establish circuit logic (step 50). RapidWorx™ tools are then used to wire together the logic with third party tools (step 52). The RapidWorx tools provide a graphical user interface to a suite of tools that guides the designer through RTL design, analysis and synthesis to placed netlist handoff. In the design completion (step 54), the designer invokes EDA tools to simulate the finished design, decides if the design meets requisite timing goals, and performs cell placement and interconnect routing (step 54). Manufacturing (step 56), is where the designer performs final validation and releases the design to manufacturing.

Figure 2:
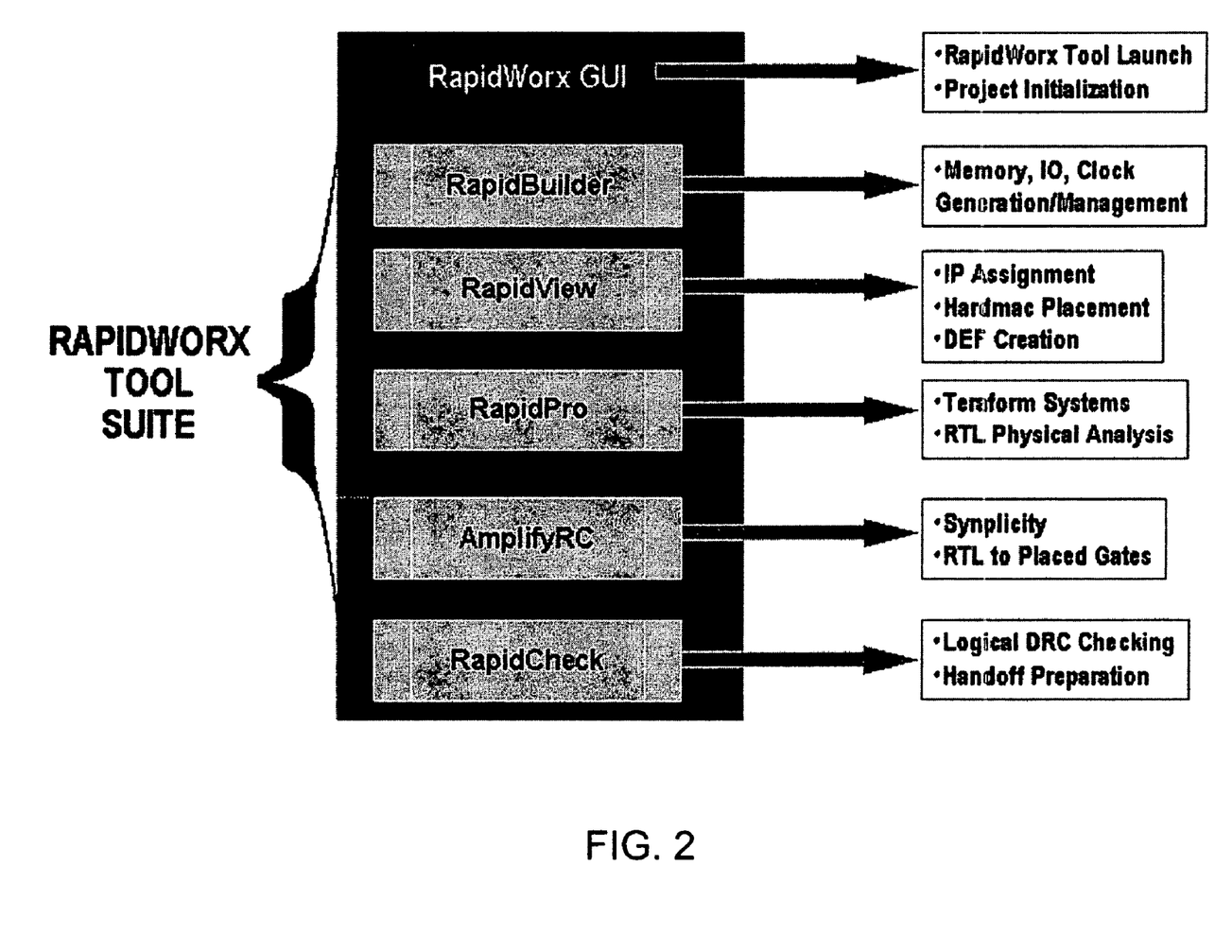
FIG. 2 is a flow diagram illustrating the RapidWorx tools in further detail.

FIG. 2 is a flow diagram illustrating the RapidWorx tools in further detail. The RapidWorx design system flow includes five basic steps. Each step is executed by a tool launched from the RapidWorx design system. The RapidWorx design system enables cross-probing between tools.

RapidBuilder is a tool that configures the Memories, I/Os, and clocks. RapidBuilder automatically generates RTL for them and managing integration into the slice. Test implementation and vector generation is completely automated with no intervention by the customer required.

RapidView is a tool that provides a floorplan view of the slice resources, allowing the designer to choose which memories, IO, PLL and other to allocate to which desired function. It has cross-probing capabilities with other RapidWorx tools.

RapidPRO is a tool that Allows Physical RTL optimization. RapidPRO checks the designer's RTL against best-practice design & implementation rules to find problematic RTL structures that create congestion and timing closure bottlenecks. This tool combines LSI Logic's RapidChip PRO Rule Set with Tera Systems TeraForm-RC to check RTL code for rule conformance.

Amplify RapidChip is a physical synthesis tool that combines RTL synthesis, placement, and optimization in a single integrated process.

RapidCheck is a tool that performs handoff rule checking. RapidCheck verifies a RapidChip netlist and database, and generates all outputs necessary for handoff to LSI Logic for layout completion and manufacturing. Handoff iterations are avoided because physical issues are addressed in the pre-built RapidChip slices and the correct-by-construction RapidWorx methodology.

One of the major challenges facing designers of application-specific integrated circuits (ASIC) is ensuring that the IC is testable. Because of this, design-for-test (DFT) techniques are becoming more common practice as the complexity of devices increases. IC's are becoming system-on-chip (SoC), with embedded blocks and structures that all require test and debug. Structures such as memory BIST, logic BIST, test structures for embedded cores and debug of embedded software all require test control at the chip level.

Boundary scan is well-known standard DFT technique (IEEE Std 1149.1 (JTAG)) that simplifies IC testing by placing boundary scan registers between pads and internal logic to provide a standard chip and board test interface. The boundary scan uses a serial scan chain to access the chip I/Os on board. Since the scan chain passes through all the input and output pads of a chip, its inputs and outputs are accessible from the board for sampling data from the other chip and updating data to another chip simultaneously. The resulting boundary-scan chain and other test features of the device are accessed through a standard interface, the JTAG Test Access Port (TAP).

As stated above, the RapidChip platform defines the total number of configurable I/Os, diffused memory, and IP resources for each available slice. This allows most of the test logic to be integrated into the slices before the customer customizes the RapidSlice platform. The RapidBuilder tool also generates a top-module RTL that includes boundary scan cells, an I/O tree for testing, and a JTAG TAP controller that can launch and monitor BIST tests for any diffused coreware or memory in the RapidSlice platform.

Thus, during customization using RapidChip, a customer creates a slice instance that will have a set of coreware diffused on the slice, where each coreware includes embedded boundary scan segments. If some of these coreware are not used during instance creation (a customer design) then there is no need to test these embedded boundary scan segments.

Several third party test synthesis tools are available that solve this problem by automatically implementing the boundary scan circuitry and board-level interface. These tools can support any boundary scan configuration, including user-defined or private instructions, and can be used to make sure that unused embedded boundary scan segments are not tested.

For custom IC's that are designed, tested and manufactured by the same entity, running the third party tools that do the boundary scan synthesis and stitching is not a problem since the entity has a license to use the tools. However, in RapidChip flow, all of the different customers that will use the RapidChip software to create their own instances may not have all the necessary third party tools in-house. And unfortunately, the tools cannot be provided to the customers because the customers may be unwilling to obtain the necessary licenses. Thus, there currently is no option to run third party tools which perform the boundary scan synthesis and stitching in RapidChip.

The problem is how to handle unused coreware having embedded boundary scan segments at the instance level without running third party tools, and still use all the files which are generated at slice creation time. A related problem is how to reuse pre-built Memory Bist and JTAG test structures to avoid the need to use a boundary scan synthesis tool during Rapidchip instance creation.

Accordingly, what is needed is a method and system for handling those unused coreware having embedded boundary scan segments in a slice without running third party boundary scan synthesis and stitching tools, while still using all the files that are generated at slice creation time. The present invention addresses such needs.

SUMMARY OF THE INVENTION

The present invention provides a method and system for creating a tap controller in a slice for use during custom instance creation to avoid the need of a boundary scan synthesis tool. Aspects of the present invention include during slice creation, using a software tool to create a test access port (TAP) from slice resources; during instance creation, allowing a customer to design a custom chip using the software tool to select which structures to use on the slice; and based on the customer selections, reconfiguring at the instance level connections between the tap controller and the selected structures.

According to the method and system disclosed herein, the present invention generates a JTAG tap controller in a slice for use during custom instance creation that avoids the need of a boundary scan synthesis tool.

DETAILED DESCRIPTION OF THE INVENTION

The present invention relates to ASIC design methodology. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 3:
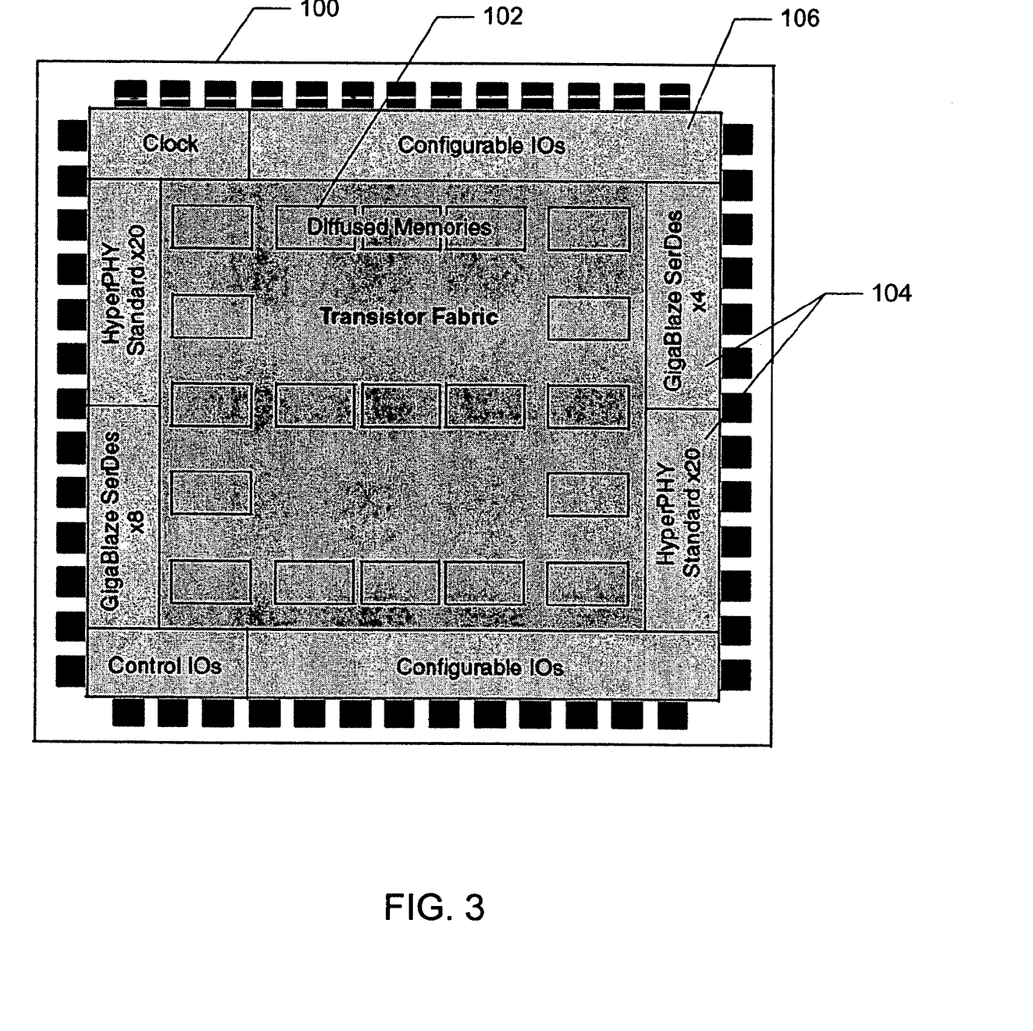
FIG. 3 is a diagram illustrating an exemplary slice.

As described above, the Assignee of the present application has provided a RapidChip platform that allows customers to customize partially manufactured semiconductor devices called slices. FIG. 3 is a diagram illustrating an exemplary slice. Each slice 100 preferably includes diffused memory blocks 102, cores 104, and a configurable I/O ring 106. The RapidChip platform defines the total number of configurable I/Os, diffused memory, and IP resources included in each slice 100. Each slice also includes embedded test structures, such as boundary scan chains, memory BIST, and a JTAG TAP controller for testing the coreware (shown in FIG. 9).

After custom configuration using RapidChip at the instance level, the slice 100 may include portions that are not used. For example, the slice may include ten cores, but the customer may choose to use only five of the cores in his or her custom design. Hence these unused portions do not have to be tested.

The present invention automates this process. According to the present invention, this is accomplished by reusing the slice connectivity data in Rapidchip for reconfiguration at the instance level, so that custom designs can be tested without access to third party tools at the customer site. This is accomplished by modifying the slice data files that define the boundary scan chain at the instance level by inserting dummy logic into the unused cores and stitching the dummy logic to the live cores, thereby keeping the order and length of the original chain intact, so the tools can run the tests.

Figure 4:
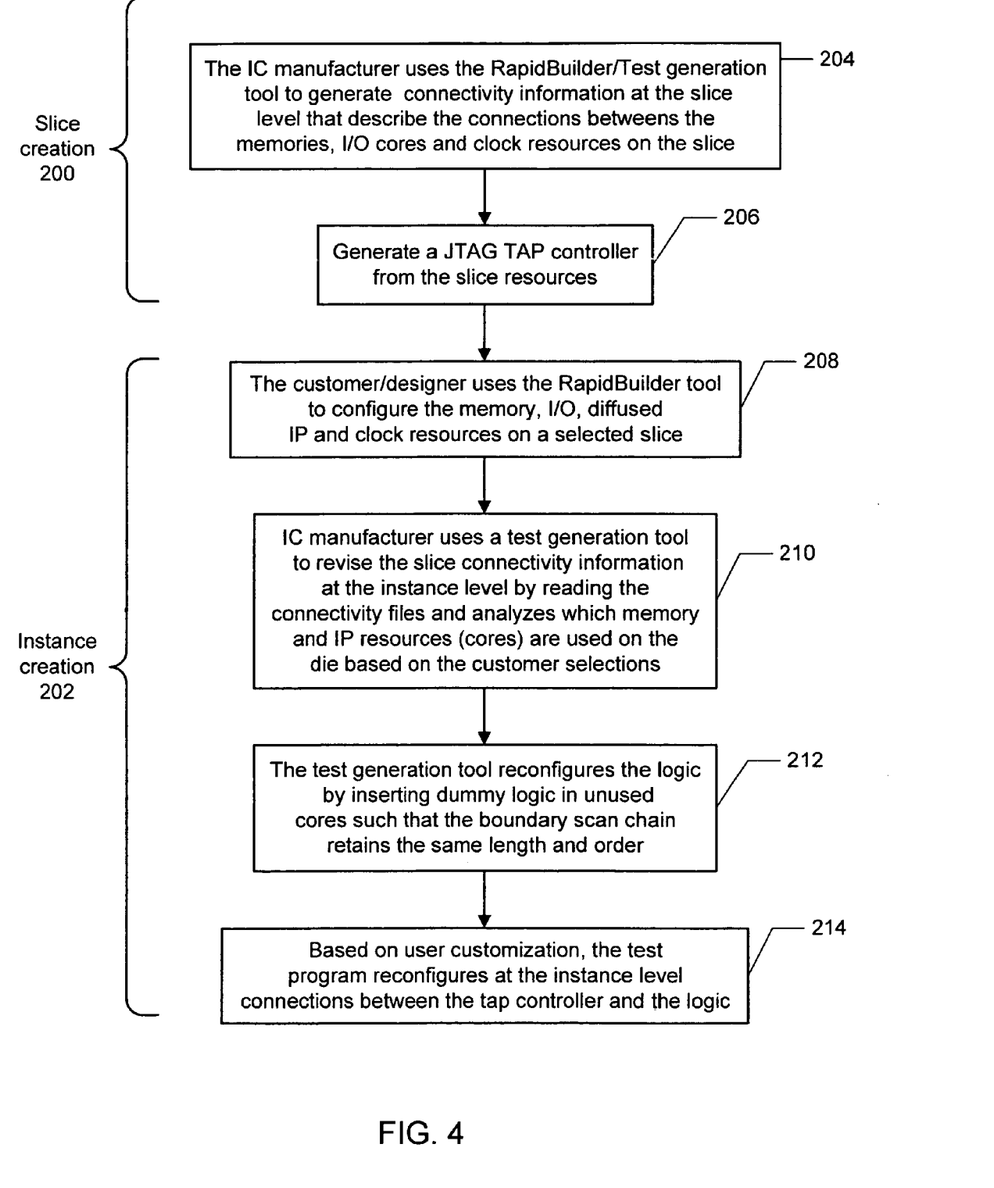
FIG. 4 is a flow diagram illustrating the process for handling of unused coreware with embedded boundary scan chains to avoid the need of a boundary scan synthesis tool during custom Instance creation in accordance with the present invention.

FIG. 4 is a flow diagram illustrating the process for handling of unused structures with embedded boundary scan chains during custom instance creation to avoid the need of a boundary scan synthesis tool in accordance with the present invention. The process includes two steps; slice creation 200, which is performed by the IC manufacturer, and instance creation 202, which is performed at the customer site. The IC manufacturer uses the RapidBuilder/test generation tool to generate connectivity information at the slice level that describe the connections betweens the memories, I/O cores and clock resources on the slice (step 204). The connectivity information is preferably in the form of a top-module RTL that includes boundary scan cells, a stitched I/O NAND tree for VIH/VIL parametric testing. A JTAG TAP controller is also generated from the slice resources (step 206). The JTAG TAP controller has an expanded instruction set that can launch and monitor BIST tests for any diffused IP or memory in the slice 100.

During instance creation 202, where a customer designs a custom chip from the slice, the customer/designer uses the RapidBuilder tool to configure the memory, I/O, diffused IP and clock resources on a selected slice 100 (step 208). The tool generates RTL code containing configured memory, I/O, and clock circuits that conform to all physical design and test rules. The I/Os and PLLs are included in the top module RTL, while the memories and clocks are included in wrappers that are subsequently instantiated in the designer's RTL code. This also includes the package pin assignment and configuration of I/O types. The user simply enters the signal name and desired I/O configuration associated with a particular package ball, and the RapidBuilder tool generates top-module RTL code instantiating I/O buffers, boundary scan cells, JTAG TAP controller, and clock structures. The designer then surrounds the customer logic with the RapidBuilder tool generated top-level module.

Upon design handoff to the IC manufacturer, a test generation tool is used to revise the slice connectivity information at the instance level by reading the connectivity files and analyzes which memory and IP resources (cores) are used on the die based on the customer selections (step 210). The test generation tool then writes a test program that reconfigures the logic by inserting dummy logic in unused cores and memories such that the boundary scan chain retains the same length and order (step 212). Test structure generation after design handoff includes stitching the scan chain according to a nearest-neighbor algorithm such that the TAP controller performs a BIST on each inferred resource. All memories and IP blocks are surrounded by a BIST wrapper. All test vectors are automatically generated, which relieves the customer of this task associated with manufacturing test. Based on user customization, the test program reconfigures at the instance level connections between the tap controller and the logic (step 214) so that if a memory or core is unused, it becomes a "pave-over" device, allowing routing resources to be run over the top of the block.

In a preferred embodiment, the present invention is implemented by providing Rapidworx with a Testgen 302 tool and an logen tool, which are used during both slice creation and instance creation.

Figure 5:
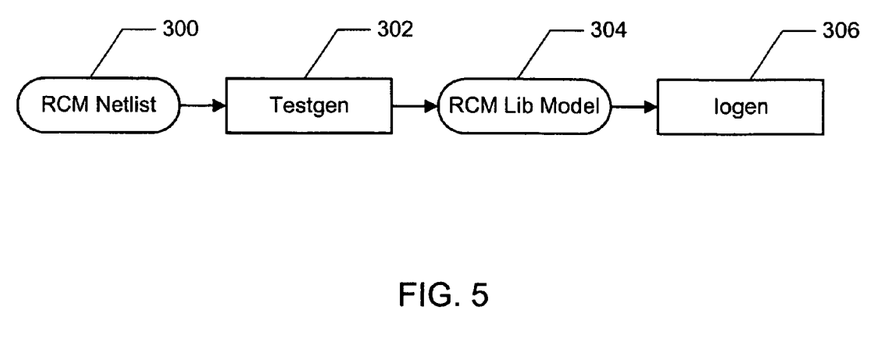
FIG. 5 is a diagram illustrating the flow for generating a library model by Testgen

FIG. 5 is a diagram illustrating the flow for generating a library model by Testgen 302, which will then be used by logen to generate a TAP Controller & Boundary Scan Module file at the slice level. The process begins by inputting an RCM netlist 300 for a particular slice into Testgen 302.

Figure 6:
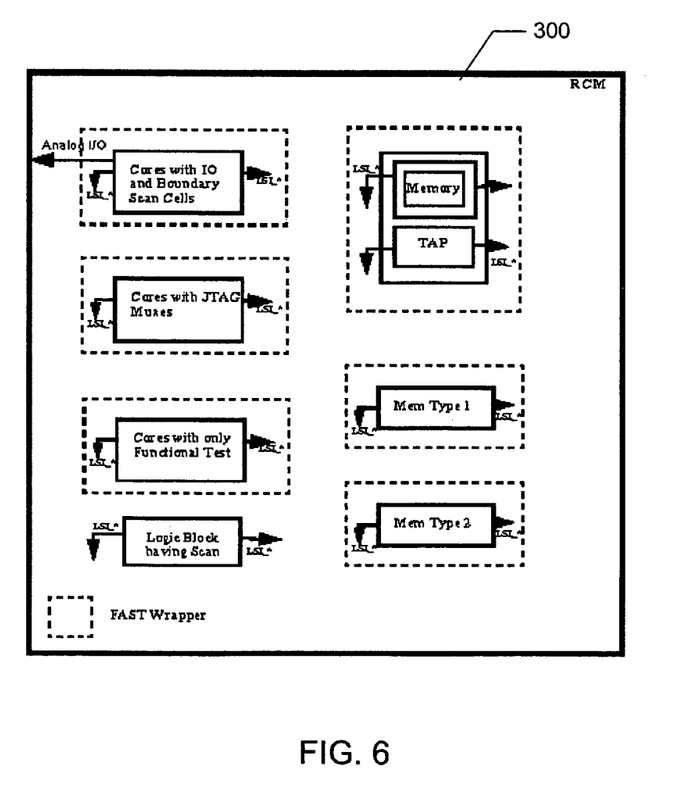
FIG. 6 is a diagram graphically illustrating the design contents of the RCM netlist before test insertion.

FIG. 6 is a diagram graphically illustrating the design contents of the RCM netlist 300 before test insertion. The RCM netlist 300 includes all the instantiations of cores and memory BIST assemblies. There is no need of functional connections at this point. Memory BIST assemblies are generated and test logic is also inserted in them using Testgen 302 or its component applications. The test connections in these assemblies will include inserting scan and bringing out membist pins to assemblies.

Figure 7:
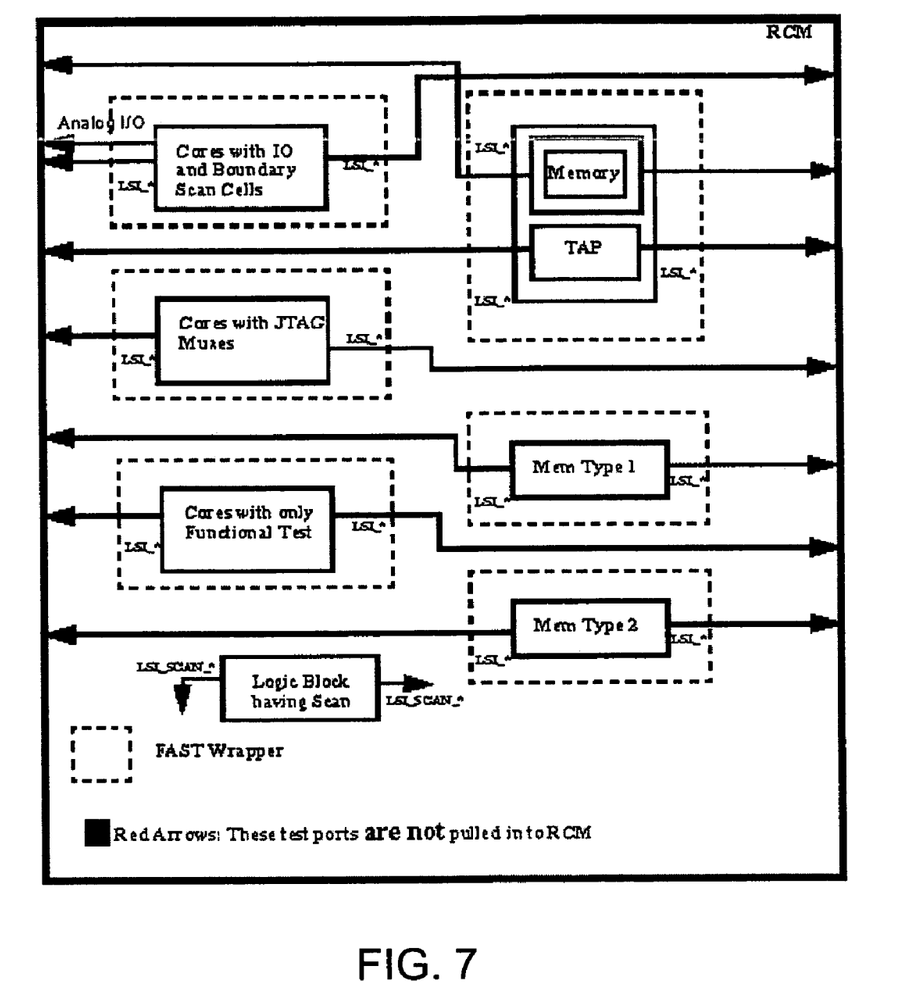
FIG. 7 is a diagram graphically illustrating the contents of the RCM after test insertion.

Referring again to FIG. 5, Testgen 302 processes the RCM netlist 300 by inserting specified cores into the slice 100. The output of Testgen 302 is an RCM library model 304, which is an abstraction of the netlist. FIG. 7 is a diagram graphically illustrating the contents of the RCM after test insertion. After test insertion in ROM, all the test pins are being brought out to RCM boundary. Scan stitching is not done yet so SCAN* pins are not being brought out. This is because scan stitching is not correct unless the customer customizes the slice to meet his design requirement. All the scan structures are not known at slice time. There will be additional scan structures during instance creation stage in the flow. All other test pins are being brought out to RCM to enable generation of boundary scan structures and TAP controller at ogen level. The RCM library model 304 is used as in input to logen 306.

Figure 8:
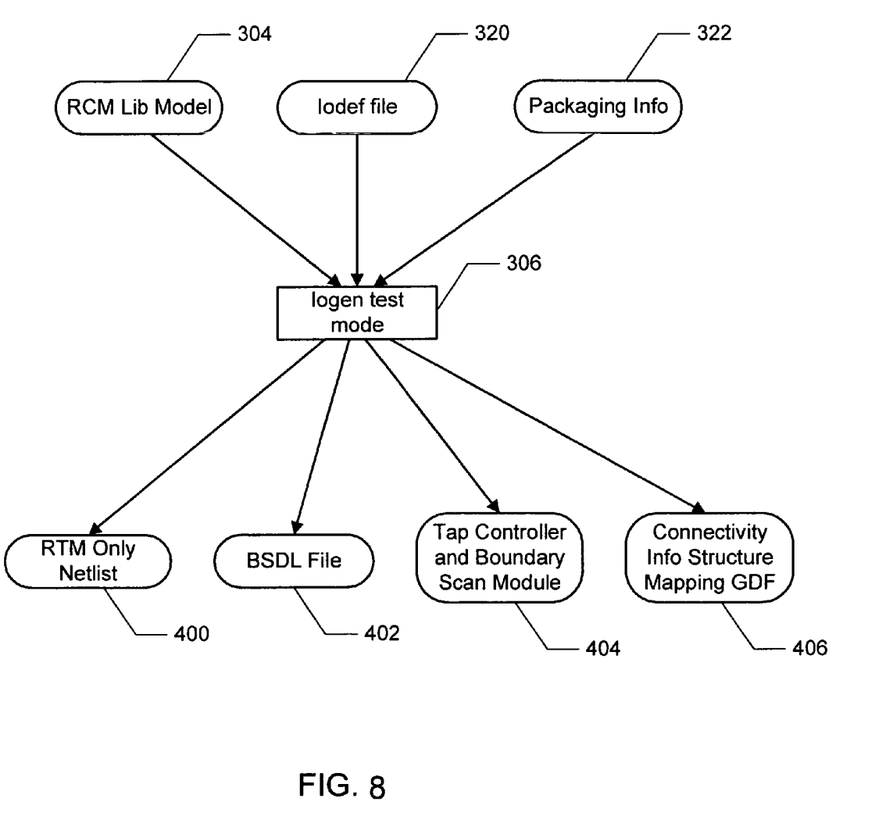
FIG. 8 is a diagram illustrating a top level flow of logen during slice creation.

FIG. 8 is a diagram illustrating a top level flow of logen 306 during slice creation. Logen 306 receives input slice information and generates an RTM only netlist 400, a BSDL (Boundary Scan Description Language) file 402, a TAP Controller & Boundary Scan Module file, 404 and a test structure GDF file 406. The input slice information includes the RCM library model 304 generated by Testgen 302, an I/O definition file 320, and packaging information 322. Using these inputs, logen 306 calls third party tools to perform boundary scan logic synthesis, generate boundary scan test patterns, and create the BSDL file 402 (the standard description language for devices complying with the IEEE 1149.1 standard file for board-level test).

Figure 9:
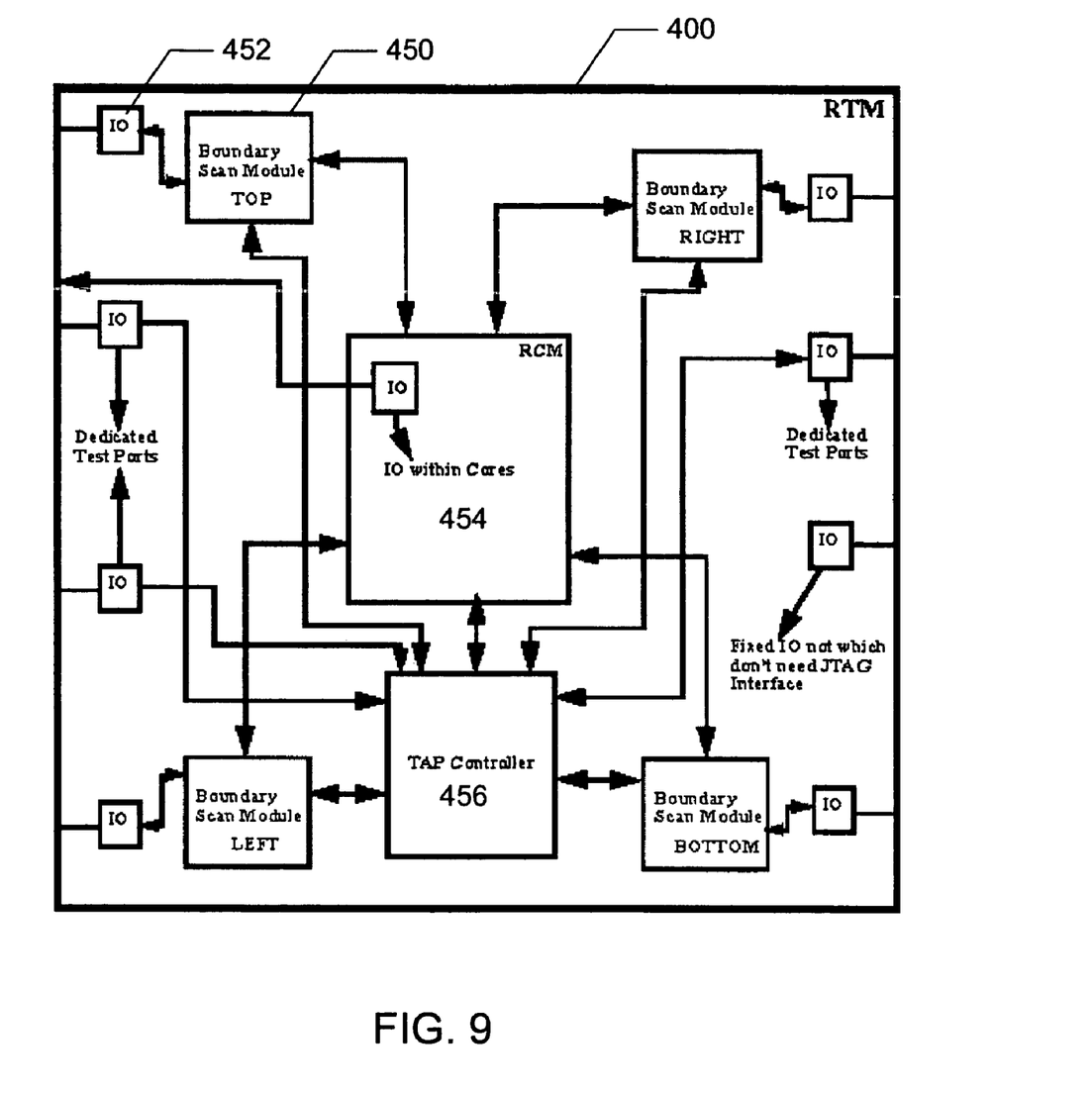
FIG. 9 is a diagram graphically illustrating the contents of the RTM file 400 after doing test insertion at top level by logen.

FIG. 9 is a diagram graphically illustrating the contents of the RTM file 400 after doing test insertion at top level by logen 306. Boundary scan modules 450 are shown coupled between 452 I/O's, cores 454 and a tap controller 456.

Logen 306 uses the RCM library model 304 to create the TAP Controller & Boundary Scan Module file 404 during slice flow. Referring again to FIG. 8, the generated TAP Controller & Boundary Scan Module file is archived by logen 306 in slice flow and is delivered as part of the slice, but will not be diffused in the slice. The TAP controller &

Boundary scan module file 404 is converted into a library model to make sure that all the properties for TAP controller and Bscan modules are available while running logen 306 and RapidBuilder in instance creation flow. These properties on the library model will help make connections to/from the TAP controller & boundary scan modules.

According to the present invention, the output files generated by logen 306 during slice creation will be reused at the instance creation level during customization. More specifically, there will be additional properties added for the TAP controller & Boundary Scan module files 404 and their ports. Logen 306 preferably calls a tool called Rapidsliceconngen, which facilitates the creation of the library model of TAP & Boundary Scan by tracing through the memory test pin connections between the TAP and RCM library model 304.

According to the present invention, additional properties are added to the TAP and Boundary scan module library models, which will be exclusive to logen 306 usage. These properties will be added by logen 306 in slice flow and read by logen 306 in instance creation flow. In this step, some changes may also be required in the TAP controller & Boundary Scan Module files 404. The purpose for making changes at this level is to freeze the definition of these modules at the slice level. The RCM Library model 304 will be used by logen 306 during subsequent instance flows to recreate the TAP & Boundary scan netlist and their interconnection. If there is a need to configure these modules based on customer usage of slice resources at instance creation stage, only the interconnect to these modules need to be changed, but no changes to the inside these modules is necessary.

This is accomplished by Rapidsliceconngen outputting the connectivity information between the different boundary scan chains to the test structure GDF file 406. The section of the test structure GDF 406 generated by rapidsliceconngen contains connectivities between RCM, TAP controller, Bscan module, and I/O ports. The properties added to the test structure GDF 406 includes the following: 1) a list of all modules that need to be connected, where the list contains RCM, TAP, the bscan module name, and I/O port; 2) The connetion type, which can be either CONNECT or ASSOCIATE. The CONNECT relationship is used for direction connection, while the ASSOCIATE relationship is used for associating I/O ports with bscan modules; And 3) the type of PROPERTY, which can be divided in to the following categories: the "property" in the database of an object; the "depth" which is dynamically calculated based on design; the "direction" of an IO cell pin that is traced to; and if none of the above are needed, a "dummy" property is given. Other kinds of property can be added as needed. The purpose of having the different flavors of properties is to remove any ambiguity when using the connection information, in this case, by IOGEN 306. Multiple properties may be assigned.

Figure 10:
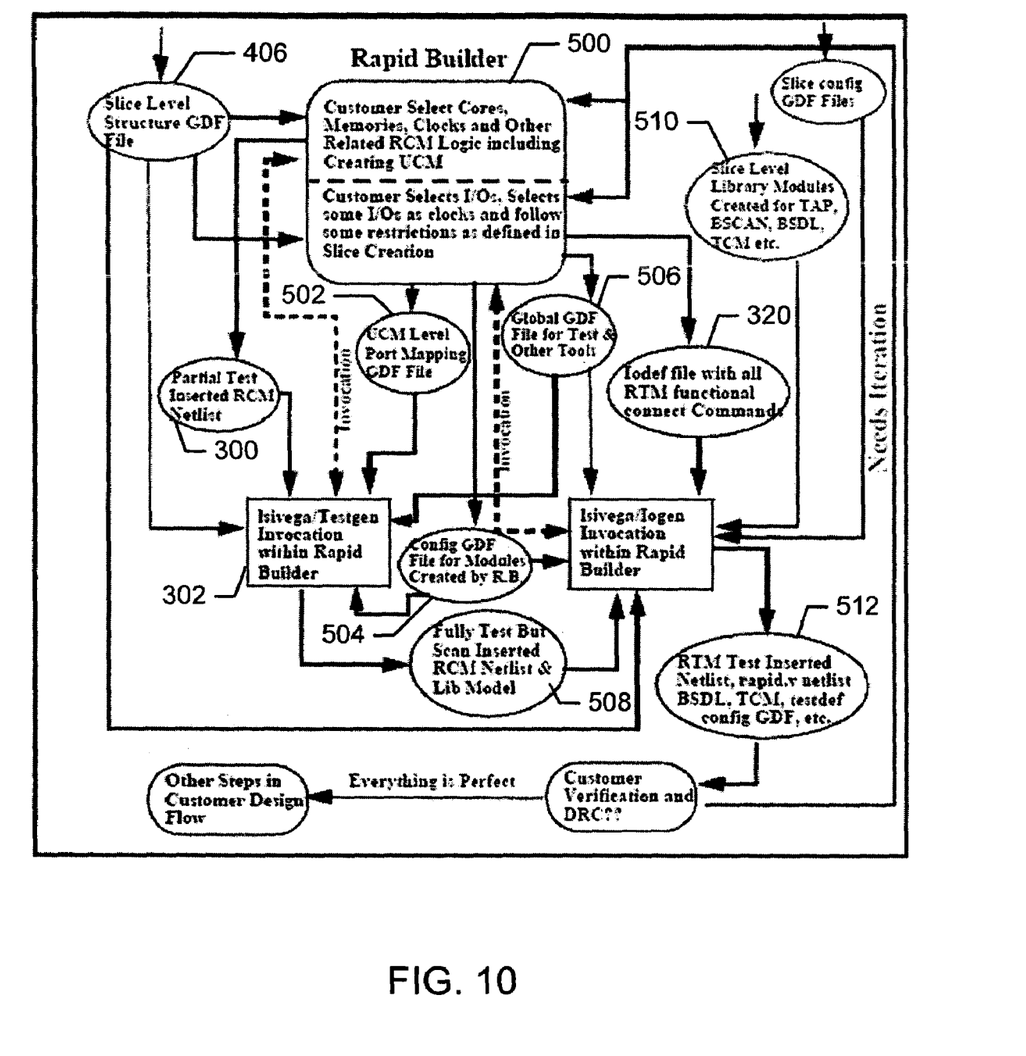
FIG. 10 is a diagram illustrating the Rapid Builder process during instance creation.

FIG. 10 is a diagram illustrating the Rapid Builder process during instance creation. The process begins when the customer invokes the Rapid Builder tool to create a custom design from one or more selected slices. From the slice definition, the customer selects cores, memories, clocks and other related RCM logic, including creating a UCM (User Core Module) (step 500). The UCM is a module generated by Rapidbuilder where the customer does all the customization he wants. In this module, the customer connects different IP, memories and other design components like 3rd party IP as desired. The customer also selects I/Os, and selects some I/Os as clocks (step 502). Once the customer enters the selection, and verifies contents of the completed UCM, Rapid Builder recreates the output files generated at the slice level. This is required because the hierarchy information of all the IP, memories selected by customer will be different from a generic slice. So the output slice files having information regarding core and memory hierarchies will need to be regenerated.

Rapid Builder invokes Testgen 300 and inputs the RCM netlist 300, the slice level test structure GDF 406, a UCM level port mapping GDF 502, a Configuration GDF file 504 for modules, and a global GDF file for test 506 and other tools. The output of Testgen 302 is a fully test, but scan inserted RCM netlist 300 and Library model 508, which is input to logen 306 along with the GDF files 504 and 506, the lodef file 320 containing all functional connect commands, and the slice level library modules e.g., TAP, BSCAN, and BSDL 510.

According to the present invention, logen 306 reads these files and determines from the connectivity information which cores and memories of the slice are unused in the custom instance. Logen 306 then reconfigures the files by inserting dummy logic into the unused cores that connects to the existing boundary scan chain, such that the length and order of the boundary scan chain remains the same. The output 512 of logen 306 includes an RTM Test inserted netlist, rapid.v netlist BSDL, TCM, and testdef file.

According to a further aspect of the present invention, logen 306 is provided with an API that enables logen 306 to read, write and modify the BSDL file 402. The BSDL file 402, which is generated at slice level and modified at instance creation stage to match the design. In a preferred embodiment, the slice BSDL file is named <slice.bsdl>, while the file modified at instance creation is named <design.bsdl>.

The API calls and changes made to the BSDL file 402 during instance creation are described below section by section using information from Test Structure GDF file.

Call to BSDL API:

set bsdlAPIObject[Bsdl "#auto" <slice.bsdl>]

the BSDL file will have sections that needs to be changed. The following sections describes those changes in detail.

1. Change the Entity:

entity slice 1810 is generic (PHYSICAL_PIN_MAP:string:="DEFAULT_PACKAGE_NAME");

where "entity" is the top module name of the instance. Initially when the BSDL file is created, the name is the slice top module name which is not the final customer instance top module name. This needs to be changed at several places in BSDL file. The following API may be called to change every occurrence of the name in the BSDL file:

$bsdlAPIObject set_bsdl_entity <top_module>

2. Checking of BSDL file Port List for correctness: logen 306 gets all the ports defined in BSDL file and see if they match against the test structure GDF file. If there is mismatch there, it is reported as an error. To get all the ports defined in BSDL file following API will be called:

set portList[$bsdlAPIObject get_all_ports]

The following API gets the port list from test structure GDF file:

set signalPortList[RAPID:FAST:SLICE:PINLIST]

Logen 306 checks if both the above list matches.

3. Change the Port List:

```
port (
    -- Port List
    LSI_TDI : in bit;
    LSI_TDO : out bit;
    LSI_TMS : in bit;
    config_IO : inout bit_vector( 415 downto 0 );
    LSI_PROCMON : out bit;
    LSI_SCAN_ENABLE : in bit;
    vddio25 : linkage bit_vector( 6 downto 0 );
    vdd2 : linkage bit_vector( 10 downto 0 );
    ....
    LSI_TCK : in bit);
```

Port names specified in the BSDL file in this section are based on slice names, which may not match the custom design names. To create correct port list logen 306 performs the following. First get and delete all in, out and inout ports from list.

```
$bsdlAPIObject delete_ports_of_type "in"
$bsdlAPIObject delete_ports_of_type "out"
$bsdlAPIObject delete_ports_of_type "inout"
```

After that, only linkage ports are in BSDL object. Now collect all ports from design by means of reading iodef file and processing (done already) and add those ports in BSDL object one by one. Also, all unused ports will be added as linkage in the BSDL file.

```
$bsdlAPIObject add_to_port_list <portName> <direction>
    <bit/bit_vector><left_index> <right_index>
```

Unused ports are calculated as follows: There is information stored for slice level port list. To get the signal port list from test structure GDF file:

```
set signalPortList [ RAPID:FAST:SLICE:PINLIST -
    RAPID:FAST:SLICE:POWERPINLIST ]
```

Logen 306 then gets the slice-instance port mapping from .csv file and iterates over all the slice level ports from the file and determines which ports are not matched against the list signalPortList. Those ports become unused ports in the instance and added in the BSDL file as follows:

```
$bsdlAPIObject add_to_port_list <portName> "linkage"
    <bit/bit_vector><left_index> <right_index>
```

4. Change the Package Map Information:

```
constant DEFAULT_PACKAGE_NAME: PIN_MAP_STRING :=
"LSI_TDI : AA08 , " &
"LSI_TDO : AB08 , " &
"LSI_TMS : W09 , " &
"LSI_TEST_IN :(W17 , " & -- LSI_TEST_IN[10]
"D08 , " & -- LSI_TEST_IN[9]
"Y09 , " & -- LSI_TEST_IN[8]
"D07 , " & -- LSI_TEST_IN[7]
"Y04 , " & -- LSI_TEST_IN[6]
"C04 , " & -- LSI_TEST_IN[5]
"B04 , " & -- LSI_TEST_IN[4]
"AA07 , " & -- LSI_TEST_IN[3]
"W03 , " & -- LSI_TEST_IN[2]
"D06 , " & -- LSI_TEST_IN[1]
"C05 ), " & -- LSI_TEST_IN[0]
....
"LSI_TCK : Y08 " ;
```

The pad pin associated with package pin needs to be changed as in the BSDL file, pad pin name will be based on slice and in instance, these names will change. The following API will be called. First of all the correctness of BSDL file will be checked with respect to test structure GDF file.

set padPackageMapList[$bsdlAPIObject get_all_port_mappings]

Logen 306 then gets the package pin for each pad pin from test structure GDF file and see if they match.

```
foreach padPin [ RAPID:FAST:SLICE:PINLIST ] {
    set packagePin [ RAPID:FAST:SLICE:$padPin:PACKAGE_PIN ]
    set bsdlPackagePin [ padPackageMapList($padPin) ]
    if { $packagePin != $bsdlPackagePin } {
        error
    }
}
```

Logen 306 then deletes all the port mapping information as everything will be added from start.

$bsdlAPIObject delete_all_port_mappings

Logen 306 then gets all the pads and corresponding package pin in bsdl file.

```
foreach padPin [ RAPID:FAST:SLICE:POWERPINLIST ] {
    set packagePin [ RAPID:FAST:SLICE:$padPin:PACKAGE_PIN ]
    $bsdlAPIObject add_to_port_group $padPin $packagePin
}
foreach padPin [ RAPID:FAST:SLICE:PINLIST -
RAPID:FAST:SLICE:POWERPINLIST ] {
    set packagePin [ RAPID:FAST:SLICE:$padPin:PACKAGE_PIN ]
    set instancePadPin [ portMapCSV $padPin ]
    ## See if this is unused pin or not. If unused, add the old name.
    if { $instancePadPin == "" } {
        $bsdlAPIObject add_to_port_mappings_list $padPin $packagePin
    } else {
        $bsdlAPIObject add_to_port_mappings_list $instancePadPin
$packagePin
    }
}
```

5. Change the Differential Pin Groups:

```
"Differential_Voltage ( (srv_d_ev_p, srv_d_ev_n), " &
"(srv_clk_p, srv_clk_n), " &
"(srv_d_odd_p, srv_d_odd_n), " &
"(clock_106_p, clock_106_n), " &
"(txp_b, txn_b), " &
"(rxp_b, rxn_b), " &
"(txp_a, txn_a), " &
"(rxp_a, rxn_a)) " ;
```

At slice level, there may not be any differential pairs defined in BSDL file. Even if they are defined, that needs to be changed as names may not be actual name as they exist in instance. So all the information present earlier will be deleted by means of API.

$bsdlAPIObject delete_all_differential_port_mappings

A method and system for handling of unused coreware with embedded boundary scan chains to avoid the need of a boundary scan synthesis tool during custom Instance creation has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for creating a tap controller in a slice for use during custom instance creation to avoid the need of a boundary scan synthesis tool, the method comprising;
    (a) during slice creation, using a software tool to create a test access port (TAP) from slice resources;
    (b) during instance creation, allowing a customer to design a custom chip using the software tool to select which structures to use on the slice;
    (c) reconfiguring instance level logic by inserting dummy logic in unused cores and memories, such that a boundary scan chain retains a same length and order; and
    (d) based on the customer selections, reconfiguring at the instance level connections between the tap controller and the selected structures.

2. The method of claim 1 wherein step (a) further includes the step of: providing as part of the slice resources slice connectivity information that describes connections betweens the memories, I/O, cores, and clock resources, wherein the memories and cores include embedded boundary scan chains, and outputting the connectivity information between the different boundary scan chains to a GDF file, including connectivity between ROM, the TAP controller, Bscan module, and I/O ports.

3. The method of claim 2 wherein step (b) further includes the step of: reusing the GDF file for the instance by reading the GDF to determine which structures in the file are used and not used based on the customer's selections.

4. The method of claim 3 wherein step (b) further includes the step of: allowing the customer to configure memory, I/O, cores and clock resources on the slice.

5. The method of claim 4 wherein step (c) further includes the step of: revising the slice connectivity information at the instance level by reading connectivity files and analyzing which memory and cores are used on the slice based on the customer selections.

6. The method of claim 1 wherein step (d) further includes the step of: stitching the boundary scan chain according to a nearest-neighbor algorithm such that the TAP controller performs a BIST on each inferred resource.

7. The method of claim 6 further includes the step of: providing an API that enables the software tool to read, write and modify a BSDL file during instance creation, wherein the BSDL file is generated at slice level and modified at instance creation to match the custom design.

8. The method of claim 7 wherein step (c) further includes the step of: generating RTL code instantiating I/O buffers, boundary scan cells, TAP controller, and clock structures.

9. The method of claim 8 wherein step (d) further includes the step of: using a test generation tool to reconfigure at the instance level connections between a tap controller and the logic so that if a memory or core is unused, routing resources are run over the top of the unused memory or core.

10. The method of claim 9 wherein step (a) further includes the step of: adding properties to the GDF including:
    (i) a list of all modules that need to be connected, where the list contains RCM, TAP, the bscan module name, and I/O port;
    (ii) a connection type, which can be either CONNECT or ASSOCIATE, where CONNECT is used for direction connection, while the ASSOCIATE relationship is used for associating I/O ports with bscan modules; and
    (iii) a PROPERTY type that removes any ambiguity when using the connection information, wherein property type includes the following categories: a "property" in a database of an object; a "depth" that is dynamically calculated based on design; a "direction" of an IO cell pin that is traced to; and if none of the above are needed, a "dummy" property is given.

11. The method of claim 1 wherein step (d) further includes the step of: using a software tool to reconfigure at the instance level connections.

12. The method of claim 1 wherein the tap controller is compliant with an IEEE 1149.1 JTAG boundary-scan standard.

13. A computer-readable medium containing program instructions for creating a tap controller in a slice for use during custom instance creation to avoid the need of a boundary scan synthesis tool, the program instructions for;
    (a) during slice creation, using a software tool to create a test access port (TAP) from slice resources;
    (b) during instance creation, allowing a customer to design a custom chip using the software tool to select which structures to use on the slice;
    (c) reconfiguring instance level logic by inserting dummy logic in unused cores and memories, such that a boundary scan chain retains a same length and order; and
    (d) based on the customer selections, reconfiguring at the instance level connections between the tap controller and the selected structures.

14. The computer-readable medium of claim 13 wherein instruction
    (a) further includes the instruction of: providing as part of the slice resources slice connectivity information that describes connections betweens the memories, I/O, cores, and clock resources, wherein the memories and cores include embedded boundary scan chains, and outputting the connectivity information between the different boundary scan chains to a GDF file, including connectivity between ROM, the TAP controller, Bscan module, and I/O ports.

15. The computer-readable medium of claim 14 wherein instruction
    (b) further includes the instruction of: reusing the GDF file for the instance by reading the GDF to determine which structures in the file are used and not used based on the customer's selections.

16. The computer-readable medium of claim 15 wherein instruction (b) further includes the instruction of: allowing the customer to configure memory, I/O, cores and clock resources on the slice.

17. The computer-readable medium of claim 16 wherein instruction (c) further includes the instruction of: revising the slice connectivity information at the instance level by reading connectivity files and analyzing which memory and cores are used on the slice based on the customer selections.

18. The computer-readable medium of claim 13 wherein instruction
   (d) further includes the instruction of: stitching the boundary scan chain according to a nearest-neighbor algorithm such that the TAP controller performs a BIST on each inferred resource.

19. The computer-readable medium of claim 13 wherein instruction
   (d) further includes the instruction of: using a software tool to reconfigure at the instance level connections.

20. The computer-readable medium of claim 19 further includes the instruction of: providing an API that enables the software tool to read, write and modify a BSDL file during instance creation, wherein the BSDL file is generated at slice level and modified at instance creation to match the custom design.

21. The computer-readable medium of claim 20 wherein instruction (c) further includes the instruction of: generating RTL code instantiating I/O buffers, boundary scan cells, TAP controller, and clock structures.

22. The computer-readable medium of claim 21 wherein instruction
   (d) further includes the instruction of: using a test generation tool to reconfigure at the instance level connections between a tap controller and the logic so that if a memory or core is unused, routing resources are run over the top of the unused memory or core.

23. The computer-readable medium of claim 22 wherein instruction
   (a) further includes the instruction of: adding properties to the GDF including:
      (i) a list of all modules that need to be connected, where the list contains RCM, TAP, the bscan module name, and I/O port;
      (ii) a connection type, which can be either CONNECT or ASSOCIATE, where CONNECT is used for direction connection, while the ASSOCIATE relationship is used for associating I/O ports with bscan modules; and
      (iii) a PROPERTY type that removes any ambiguity when using the connection information, wherein property type includes the following categories: a "property" in a database of an object; a "depth" that is dynamically calculated based on design; a "direction" of an IO cell pin that is traced to; and if none of the above are needed, a "dummy" property is given.

24. The computer-readable medium of claim 13 wherein the tap controller is compliant with an IEEE 1149.1 JTAG boundary-scan standard.

* * * * *